(12) United States Patent
Choi et al.

(10) Patent No.: US 9,120,669 B2
(45) Date of Patent: Sep. 1, 2015

(54) PROCESS FOR MAKING NANOCONE STRUCTURES AND USING THE STRUCTURES TO MANUFACTURE NANOSTRUCTURED GLASS

(75) Inventors: Hyungryul Choi, Cambridge, MA (US); Chih-Hao Chang, Cambridge, MA (US); Kyoo Chul Park, Cambridge, MA (US); Gareth H McKinley, Acton, MA (US); George Barbastathis, Boston, MA (US); Jeong-gil Kim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 748 days.

(21) Appl. No.: 13/446,053

(22) Filed: Apr. 13, 2012

(65) Prior Publication Data
US 2013/0025322 A1 Jan. 31, 2013

Related U.S. Application Data

(60) Provisional application No. 61/477,792, filed on Apr. 21, 2011, provisional application No. 61/491,939, filed on Jun. 1, 2011.

(51) Int. Cl.
*C03C 15/00* (2006.01)
*B81C 1/00* (2006.01)

(52) U.S. Cl.
CPC ......... *B81C 1/00111* (2013.01); *B81C 1/00103* (2013.01); *B81C 2201/0132* (2013.01)

(58) Field of Classification Search
CPC ............ B81C 1/00103; B81C 1/00111; B81C 2201/0132

USPC .......................................... 216/11, 41, 67, 80
See application file for complete search history.

(56) References Cited

U.S. PATENT DOCUMENTS

| 2,911,759 | A | 11/1959 | Pilkington et al. |
| 3,338,696 | A | 8/1967 | Dockerty et al. |
| 6,334,856 | B1 | 1/2002 | Allen |
| 2005/0261632 | A1 | 11/2005 | Xu |
| 2010/0167502 | A1* | 7/2010 | Yen et al. ...................... 438/478 |
| 2011/0051220 | A1* | 3/2011 | Lee ............................... 359/275 |
| 2012/0281729 | A1* | 11/2012 | Ou et al. ....................... 374/187 |
| 2013/0227972 | A1* | 9/2013 | Hatton et al. ..................... 62/71 |

OTHER PUBLICATIONS

Wikipedia, The Free Encyclopedia, "Poly(methyl methacrylate)", via https://web.archive.org/web/20100214055934/http://en.wikipedia.org/wiki/Poly(methyl_methacrylate) ; pp. 1-4; Feb. 14, 2010.*

(Continued)

*Primary Examiner* — Binh X Tran
(74) *Attorney, Agent, or Firm* — Sam Pasternack; MIT Technology Licensing Office

(57) ABSTRACT

Fabrication method. At least first and second hardmasks are deposited on a substrate, the thickness and materials of the first and second hardmask selected to provided etch selectivity with respect to the substrate. A nanoscale pattern of photoresist is created on the first hardmask and the hardmask is etched through to create the nanoscale pattern on a second hardmask. The second hardmask is etched through to create the desired taper nanocone structures in the substrate. Reactive ion etching is preferred. A glass manufacturing process using a roller imprint module is also disclosed.

5 Claims, 2 Drawing Sheets

(56) References Cited

OTHER PUBLICATIONS

Hua Tan; "Roller Nanoimprint Lithography", Journal of Vacuum Science and Technology. B 16(6), Nov./Dec. 1998, pp. 3929-3928.*
Wikipedia, The Free Encyclopedia, "Glass" via https://web.archive.org/web/20110217202318/http://en.wikipedia.org/wiki/Glass ;Feb. 17, 2011).*
International Search Report and Written Opinion Issued in Connection with International Application No. PCT/US2012/034019.
Y.F. Huang, et al., Nature Nanotechnology, 2, pp. 770-774, (2007).
C.-T. Wu et al., Chemistry of Materials, 22, pp. 6583-6589, (2010).
C. Su et al., Applied Surface Science, 253, pp. 2633-2636, (2006).
K. Choi et al., Advanced Materials, 22, pp. 3713-3718, (2010).
X. Gao et al., Advanced Materials, 19, pp. 2213-2217, (2007).
E. Martines et al., Nano Letters, 5, pp. 2097-2103, (2005).
Y. M. Song et al., Optics Express, 18, pp. 13063-13071, (2010).
L. Sainiemi, et al., Advanced Materials, 23, pp. 122-126, (2011).
J Q. Xi. et al., Nature Photon, 1, pp. 176-179, (2007).
J. Zhu, et al., Nano Letters, 10, pp. 1979-1984, (2009).
P. Vukusic and J. R. Sambles, "Photonic structures in biology," Nature, 424, 852-855 (2003).
Y. Kanamori, M. Sasaki, and K. Hane, "Broadband antireflection gratings fabricated upon silicon substrates," Opt. Lett., 24(20), 1422-1424 (1999).
M. Nosonovsky and B. Bhushan., "Roughness optimization for biomimetic superhydrophobic surfaces," Microsyst. Technol., 11, 535 (2005).
K.-C. Park, H. J. Choi, C.-H. Chang, R. E. Cohen, G. H. McKinley, and G. Barbastathis, "Nanotextured Silica Surfaces with Robust Super-Hydrophobicity and Omnidirectional Broadband Super-Transmissivity," ACS Nano., (2012).

* cited by examiner

PROCESS FOR MAKING NANOCONE STRUCTURES AND USING THE STRUCTURES TO MANUFACTURE NANOSTRUCTURED GLASS

This application claims priority to U.S. Provisional application Ser. No. 61/477,792 filed on Apr. 21, 2011 and to U.S. provisional application Ser. No. 61/491,939 filed on Jun. 1, 2011, the contents of both of which are incorporated herein in their entirety by reference.

This invention was made with government support under Grant No. W911NF-07-D-0004 awarded by the Army Research Office. The government has certain rights in this invention.

BACKGROUND OF THE INVENTION

This invention relates to methods for making high aspect ratio nanocone structures that can be used to imprint nanoscale patterns on glass in an integrated glass manufacturing system.

Nanostructured surfaces have been widely studied for their superior optical and wetting properties such as antireflection and superhydrophobicity/hydrophilicity [1, 2, 3]. Due to their subwavelength feature size, such nanostructures behave as an effective medium with gradually varying index of refraction. Such a surface can be used to suppress Fresnel reflection at material interfaces, thereby acting as an antireflection surface and allowing broadband light to pass through without reflection losses [4]. In addition, both hierarchical roughness from those structures and the intrinsic chemical property of the surfaces can induce artificial super hydrophobicity and/or superhydrophilicity which can be applied as self-cleaning and anti-fogging surfaces, respectively [5,6].

Although these notable properties of multi-functional surfaces are well understood, fabricating defect-free nanostructured surfaces with multiple functionalities remains a difficult engineering challenge as a result of limitations of existing nanofabrication methods. The performance of these nanostructured surfaces are determined by their geometry. It is thus necessary to fabricate gradually tapered structures with small feature sizes ($\Lambda$) and large height (H). The higher the aspect ratio (H/$\Lambda$) the structures have, the better the optical and wetting properties they exhibit [7].

Nanostructured surfaces can be prepared by several existing fabrication methods such as electron beam lithography [8], nanoimprint/polymer replication [9], deposition of multilayer porous films or chemical materials [10], and colloidal lithography [11]. However, it is difficult to achieve high aspect ratio structures (greater than five) with a gradual tapered profile using prior art techniques. That is to say, the properties of subwavelength nanocone structures fabricated using existing techniques have limited performance.

Natural materials often have hierarchical structures on their surfaces. For example, a lotus leaf [5, 14] has hierarchical microstructures on its surface which keeps the plant clean for photosynthesis. These structures employ both material and geometric effects to render the surface superhydrophobic, thereby allowing water droplets to form spherical beads to remove surface particle contaminants. Using similar design principles it is possible to engineer a textured superhydrophobic surface that can self-clean. Such nanostructures can also be rendered superhydrophilic by controlling the surface treatment thereby allowing the surface to be anti-fogging.

By understanding these nature-inspired principles, it is possible to design surfaces that have combined wetting (self-cleaning and/or anti-fogging) and optical (antireflection, lossless transmission) properties. Using advanced lithography and multiple plasma etching processes, the methods disclosed herein are able to produce glass that is anti-glare, near-perfect transmitting, and selectively self-cleaning and/or anti-fogging.

It is therefore an object of the present invention to disclose methods for making high aspect ratio nanocone structures and using the structures to imprint a pattern during glass manufacture.

SUMMARY OF THE INVENTION

In a first aspect, the invention is a method for fabricating high aspect ratio tapered nanocone structures including depositing at least first and second hardmasks on a substrate, the thicknesses and materials of the first and second hardmasks selected to provide etch selectivity with respect to the substrate. A nanoscale pattern of photoresist is created on the first hardmask. The first hardmask is etched through to create the nanoscale pattern on the second hardmask and the second hardmask is etched through to create the desired tapered nanocone structures in the substrate.

In a preferred embodiment of this aspect of the invention the etching is reactive ion etching. Suitable reactive ion etching is CMOS plasma etching. The substrate may be glass and either a single side or both sides of the glass may be etched depending on the particular application. Superhydrophilic or superhydrophobic, and anti-reflective, surfaces may be created.

In another aspect, the invention is a method for manufacturing glass with micro/nanostructured surface texture. Glass above its transition temperature is provided and the glass passes through a roller imprint module, the roller imprint module including a roller having a periodic structure on its surface to imprint the periodic structure to the glass surface. The periodic structure has a selected period and height.

DESCRIPTION OF THE PREFERRED EMBODIMENT

Figure 1:
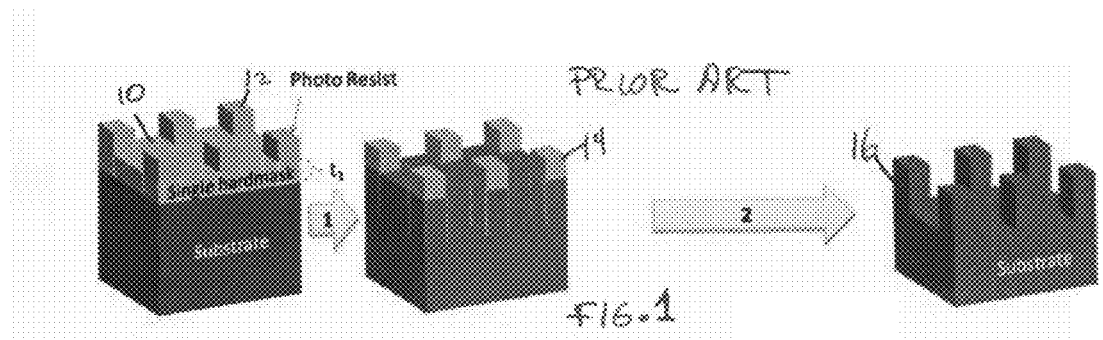
FIG. 1 is a schematic illustration of a prior art approach for fabricating tapered nanocone structures.

With reference first to FIG. 1, a conventional approach to fabricating tapered nanocone structures is based on a single hardmask 10. In FIG. 1, the numbered arrows denote etching processes. Photoresist 12 creates a pattern on the single hardmask 10. Reactive ion etching then produces the structure 14 in the hardmask 10. Thereafter, the etching system etches material away leaving the structure 16. Both the thickness of the hardmask 10 ($t_1$) and etch selectivity between the hardmask 10 and the substrate 16 would determine the height of the resulting structures. However, this process is limited to the etch rate and thickness of the single hardmask. That is to say, the final height is restricted to the material of the hardmask 10 and its thickness $t_1$, so that the height and profile of the nanocone structures are not effectively controlled.

Figure 2:
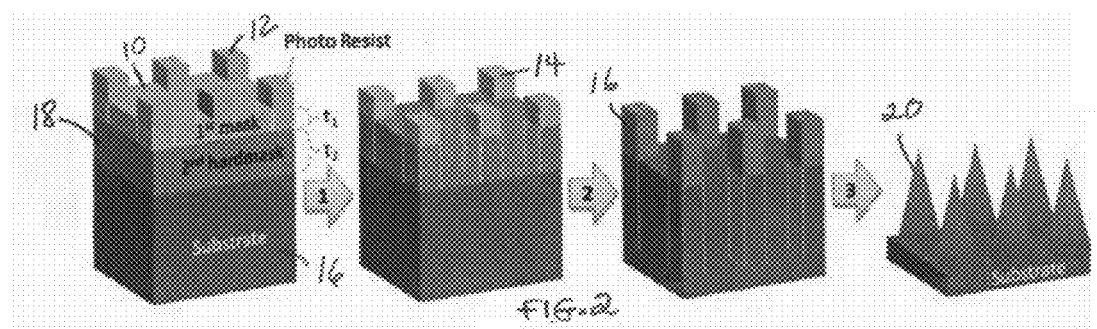
FIG. 2 is a schematic illustration of embodiments disclosed herein for making high aspect ratio nanocone structures.
Figure 3:
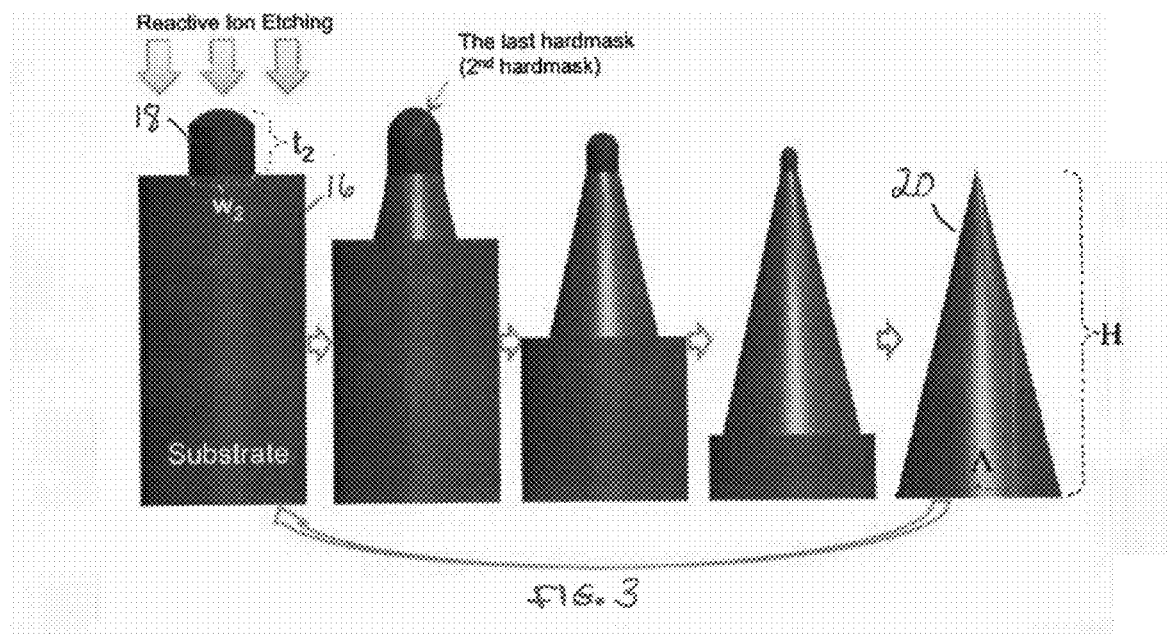
FIG. 3 is a schematic illustration of final steps for creating the high aspect ratio nanocone structures.

The present invention is based on using multiple-step plasma etching using shrinking masks to get more flexible choices of materials and thicknesses for better control of the height and profile of nanocone structures. With reference now to FIG. 2, a second hardmask 18 is deposited below the first hardmask 10. The etching process proceeds as shown by the numbered arrows in FIG. 2 ultimately resulting in a nanocone structure 20. FIG. 3 shows the etching process at the end of the procedure. As shown, the second hardmask 18 shrinks during the process of creating the nanocone 20. It is important to note that while two hardmasks are illustrated, there can be any number of hardmasks to provide desired nanocone structures. Since the process disclosed herein is based on standard CMOS plasma etching, it is compatible with and can be adapted to any lithographic techniques. Any desired nanoscale pattern can be transferred to the first hardmask 10 which has a high etch selectivity to the pattern during the first etching. The patterned first hardmask 10 is then used as another protective layer to etch through the second hardmask 18. The height of the structures produced herein can be designed and determined by the etching selectivity between the first and second hardmask layers and their thicknesses ($t_1$ and $t_2$).

An important feature of the present invention is utilizing mask materials that are etched, but at a much slower rate as compared to the substrate. This characteristic allows the resulting profile to be tapered. FIG. 3 illustrates the schematic cross sections of the last etching process which is equivalent to the arrow three shown in FIG. 2, for tapered nanocone structures. The aspect ratio of the resulting nanocone structures results not only from the dimension of the width of the first beginning pattern ($w_2$) but also the thickness of the second hardmask 18 ($t_2$). The underlying mask being etched away tends to be directional, at the same tune the second mask is shrinking. This mask covers the tip of the nanocone structures for providing a desired slope of nanocone structures which is the aspect ratio (H/Λ). If a larger height is desirable, the etch process can be repeated by using the tapered profile to etch into another material. Note that since all of the processes are done in vacuum, structure collapse associated with surface tension in wet etches is avoided.

The present invention allows the aspect ratio and profile of the nanocone structures to be precisely controlled using the multi-step etching technique with shrinking masks as disclosed herein. The fabrication method disclosed herein is compatible with and can be adapted to all conventional two-dimensional lithography techniques. Since the resist pattern is transferred to the first shrinking mask, the features can be patterned with any lithographic process. Moreover, self-assembly approaches such as colloidal lithography or block copolymer can be used to pattern the multiple-shrinking masks. The tapered nanocone structures made by the process of the invention are suitable for enhancing transmission (anti-reflectivity) and wetting properties. No matter what kind of material the substrate is made of, the pattern can be transferred to the substrate with any desired aspect ratio. Since we flexibly change both material and thickness of the hardmask layers, reactive ion etching can be conducted with appropriate gases with respect to etch rates of each hardmask, and then the desired nanocone structures may be attained with multiple functionalities. Using the current technique, it is not necessary to remove any of the hardmasks because the last hardmask is used for creating tapered nanocone structure while being etched away during reactive ion etching that is directional.

The aspect ratio and shape of the nanocone structures can be optimized to achieve better wetting or optical functions with the disclosed fabrication method [17]. By texturing sub-wavelength nanocones on both sides of glass through this fabrication process and modifying their surface energies, it is possible to combine high pressure robustness of superhydrophobicity and near-perfect transparency (or anti-reflection property). The nanocone surfaces made herein can show macroscopic anti-fogging for practical applications including transparent windshields and goggles that may be self-cleaning [17].

Figure 4:
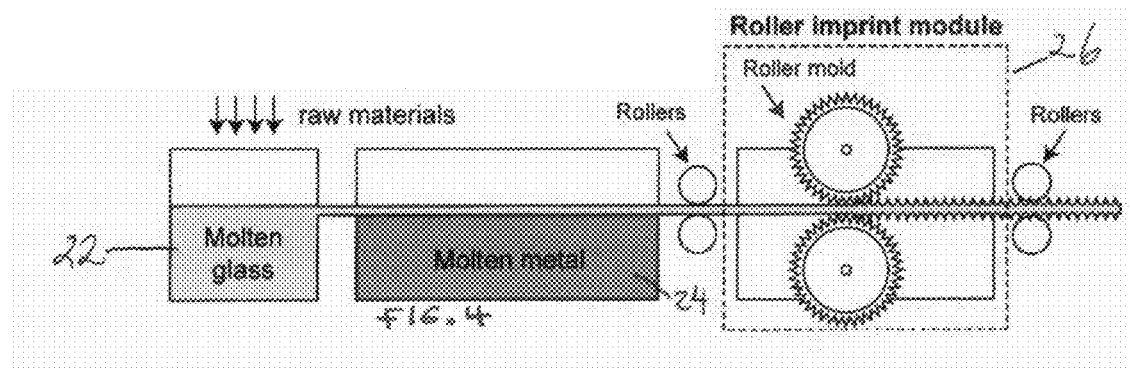
FIG. 4 is a schematic illustration of an embodiment of the glass manufacturing process disclosed herein.

Another aspect of the invention is a method for manufacturing glass with a micro/nanostructured surface texture. A principle of the method disclosed herein for glass manufacture is to integrate a roller imprint module into existing flat glass manufacturing methods. Roll-to-roll nanoimprint processes have recently been proposed to mold polymer structures, but it is believed by the inventors that this disclosure is the first to integrate these processes into a continuous textured glass manufacturing system. FIG. 4 illustrates a preferred embodiment implemented on the commonly known, patented float-glass (Pikington) process [15]. With reference to FIG. 4, a container 22 was used to melt raw glass materials (such as sand, limestone, etc.) at temperatures above 1050° C. The molten glass then floats on top of molten metal 24 (such as tin, lead, etc.) to shape the glass to be flat. The glass then exits the molten metal container and is annealed by cooling to around 650° C. During this phase, a roller imprint module 26 is added to the system, so that the surface of the glass can be imprinted with micro-nanoscale texture. A temperature gradient (or local heating) is required so that the glass can be allowed to reflow during the mechanical molding process (above glass transition temperature), but solidify immediately after (below glass transition temperature). The actual imprint temperature depends on the glass composition and can be adjusted accordingly. After the imprint process, the textured glass is cooled to room temperature. This method thus presents a continuous manufacturing process from raw materials to glass with textured micro/nano scale structures.

Figure 5:
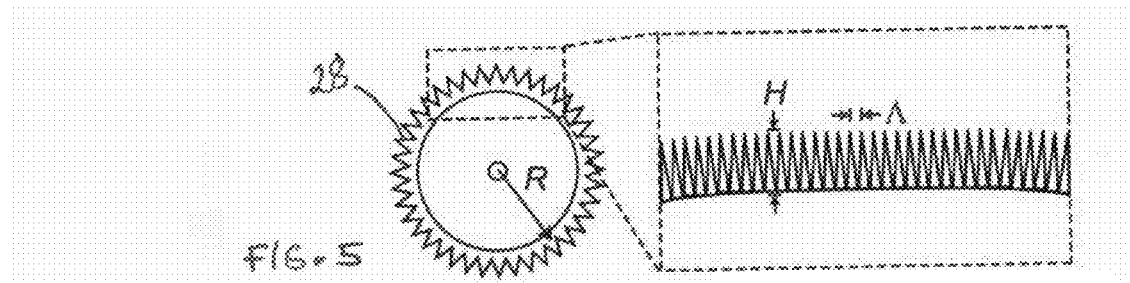
FIG. 5 is a schematic illustration of a roller imprint element.

An important component of the roller imprint module 26 is illustrated in FIG. 5. The roller element 28 consists of a solid rotating cylinder with radius R. The surface of the roller element 28 contains periodic structures with period Λ and height/depth H. These values can range from the nano to the micro scale, depending on the design of the texture. The actual topographic profile is designed to be the inverse pattern of the desired structure geometry on the glass surface. The roller mold 28 can be patterned and etched using standard lithographic micromachining techniques. The material of the roller element 28 is selected for high operating temperature above the imprint temperature of the glass to be processed. A thin layer of anti-adhesion film can be deposited on top of the roller element, conforming to the geometry, to ensure glass detachment during imprint. Of course, the processes disclosed herein for making the nanocone structures are suitable for making the imprint roller.

Figure 6:
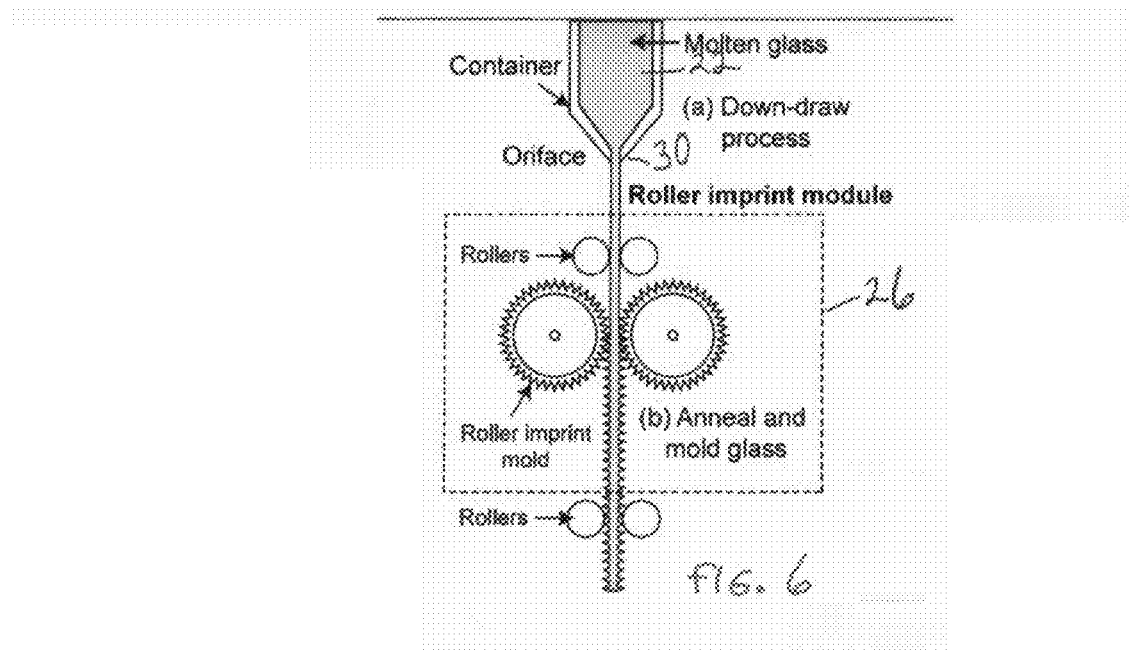
FIG. 6 is schematic illustration of another embodiment of the invention for manufacturing glass with micro/nanostructures on its surface.

Those who are skilled in the art will recognize that the principle of the invention can be applied to any continuous manufacturing process of flat glass. For example, FIG. 6 illustrates an alternative embodiment as implemented on a down-drawn process. In such a scheme, molten glass raw materials 22 are poured into a high temperature container as shown in FIG. 6. An open orifice 30 allows the molten glass to flow out from the container. The molten glass is then drawn downwardly and shaped by gravity to be flat. During the typical annealing temperature (approximately 650° C.) the roller imprint module 26 is introduced so that the micro/nano structure texture can be imprinted on the glass surface as shown in the figure.

The method disclosed herein can also be implemented with the commonly used fusion process [16]. In this process a container without an orifice is used to melt raw materials, and molten glass is allowed to overflow and flow down the outside walls of a container. The molten glass is then drawn downwardly and shaped by gravity. The roller imprint module 26 can then be inserted during the annealing cycle to imprint the surface micro/nanostructure texture. The method disclosed herein is highly versatile and can be embodied in many existing manufacturing processes for flat glass. In addition, the method disclosed herein can be designed as a module component such that it can be added to existing production infrastructure already in place thereby allowing scalable, cost-effective manufacturing of micro/nanoscale textured flat glass.

The method disclosed herein can be used to make glass that has multi-function properties such as anti-glare, enhanced transmission, self-cleaning, and anti-fogging. A primary application of the invention disclosed herein is the solar power industry in which solar panels made by the disclosed processes with reduced reflection and self-cleaning properties can increase panel efficiency and reduce maintenance costs. Other uses include anti-fogging effects for car windshields and eyeware.

The aspect ratio and shape of nanocone structures disclosed herein can be optimized to achieve better wetting or better optical functions [17]. By texturing the subwavelength nanocones on both sides of glass through this fabrication process and modifying their surface energies, it is possible to combine high pressure robustness of superhydrophobicity and near-perfect transparency (or anti-reflection property). The nanocone structures can show macroscopic anti-fogging function for practical applications including transparent windshields and goggles that are self-cleaning outside. The present invention can also be used to produce a protective glass for use with digital cameras. In this case nearly 100% of the incident light with a wide angle can be collected without any loss so that pictures with better quality may be taken, even at night. Interference affects can also be eliminated.

The numbers in brackets refer to the references appended hereto all of these references are incorporated herein by reference.

It is recognized that modifications and variations of the present invention will occur to those of ordinary skill in the art and it is intended that all such modifications and variations be included within the scope of the appended claims.

REFERENCES

[1] Y. F. Huang, et al., *Nature Nanotechnology*, 2, pp. 770-774, (2007)

[2] C.-T. Wu et al., *Chemistry of Materials*, 22, pp. 6583-6589, (2010)

[3] C. Su et al., *Applied Surface Science*, 253, pp. 2633-2636, (2006)

[4] K. Choi et al., *Advanced Materials*, 22, pp. 3713-3718, (2010)

[5] X. Gao et al., *Advanced Materials*, 19, pp. 2213-2217, (2007)

[6] E. Martines et al., *Nano Letters*, 5, pp. 2097-2103, (2005)

[7] Y. M. Song et al., *Optics Express*, 18, pp. 13063-13071, (2010)

[8] T. Tamura, et al., *Optical MEMS* 2010, Japan, (2010)

[9] L. Sainiemi, et al., *Advanced Materials*, 23, pp. 122-126, (2011)

[10] J. Q. Xi, et al., *Nature Photon*, 1, pp. 176-179, (2007)

[11] J. Zhu, et al., *Nano Letters*, 10, pp. 1979-1984, (2009)

[12] P. Vukusic and J. R. Sambles, "Photonic structures in biology," *Nature*, 424, 852-855 (2003).

[13] Y. Kanamori, M. Sasaki, and K. Hane, "Broadband antireflection gratings fabricated upon silicon substrates," *Opt. Lett.*, 24(20), 1422-1424 (1999).

[14] M. Nosonovsky and B. Bhushan., "Roughness optimization for biomimetic superhydrophobic surfaces," *Microsyst. Technol.*, 11, 535 (2005).

[15] L. A. B. Pilkington et. al., "Manufacture of flat glass," U.S. Pat. No. 2,911,759, 1954.

[16] S. M. Dockerty et. al., "Sheet forming apparatus," U.S. Pat. No. 3,338,696, 1964.

[17] K.-C. Park, H. J. Choi, C.-H. Chang, R. E. Cohen, G. H. McKinley, and G. Barbastathis, "Nanotextured Silica Surfaces with Robust Super-Hydrophobicity and Omnidirectional Broadband Super-Transmissivity," *ACS Nano.*, (2012).

What is claimed is:

1. Method for fabricating tapered nanocone structures having an aspect ratio greater than five comprising:
   depositing at least first and second hardmasks on a substrate, the thicknesses and materials of the first and second hardmasks selected to provide etch selectivity with respect to the substrate, wherein the materials of the at least first and second hardmasks etch at a rate lower than an etch rate of the substrate;
   creating a nanoscale pattern of photoresist on the first hardmask;
   etching through the first hardmask to create the nanoscale pattern on the second hardmask; and
   etching through the second hardmask to create desired tapered nanoconed structures in the substrate.

2. The method of claim 1 wherein the etching through the first hardmask and the etching through the second hardmask is reactive ion etching.

3. The method a claim 1 wherein the substrate is glass.

4. The method of claim 3 wherein both sides of the glass are etched.

5. The method of claim 3 wherein superhydrophilic or superhydrophobic surfaces are created.

\* \* \* \* \*